Sept. 27, 1966 G. C. ONODERA 3,275,911
SEMICONDUCTOR CURRENT LIMITER
Filed Nov. 6, 1963 2 Sheets-Sheet 1
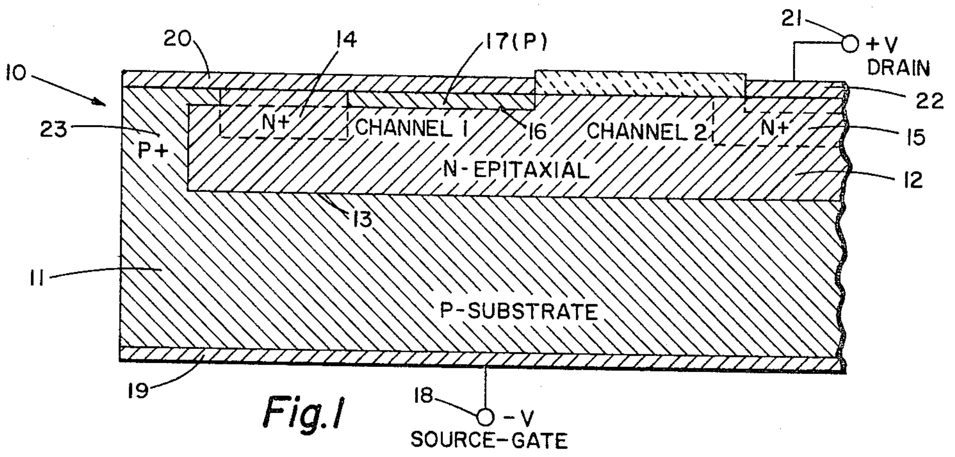
Fig.1
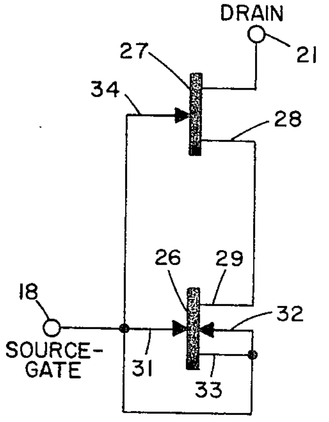
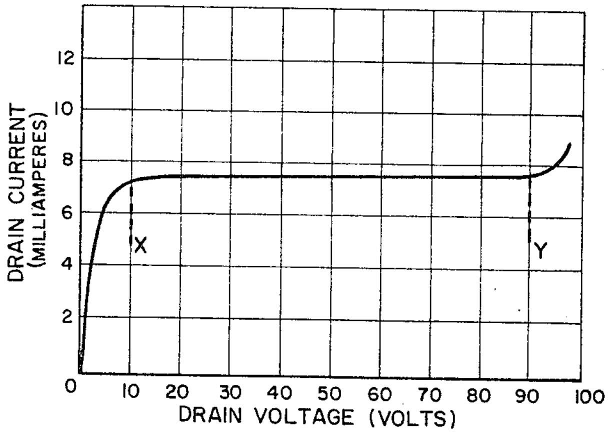
Fig.2 Fig.3
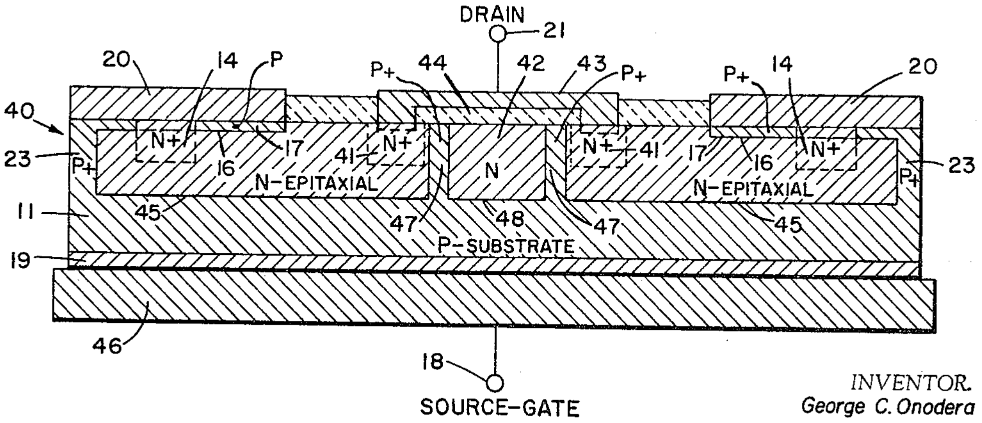
INVENTOR.
George C. Onodera
Fig.4
BY
Mueller & Aichele
ATTY'S.

Sept. 27, 1966 G. C. ONODERA 3,275,911

SEMICONDUCTOR CURRENT LIMITER

Filed Nov. 6, 1963

2 Sheets-Sheet 2

INVENTOR.
George C. Onodera

BY Mueller & Aichele

ATTY'S

United States Patent Office 3,275,911

Patented Sept. 27, 1966

3,275,911

SEMICONDUCTOR CURRENT LIMITER

George C. Onodera, Phoenix, Ariz., assignor to Motorola, Inc., Franklin Park, Ill., a corporation of Illinois Filed Nov. 6, 1963, Ser. No. 321,852
9 Claims. (Cl. 317—235)

This invention relates generally to the semiconductor art, and in particular to a field effect semiconductor device of the type known as a current limiter.

A great deal of research has been done on field effect semiconductor devices since the principles were presented by W. Shockley in an article entitled, "A Unipolar Field-Effect Transistor," Proc. IRE, vol. 40, pp. 1365-1376, November, 1952. However, the difficult problems of fabricating acceptable field effect devices have held back their introduction in commercial markets until recently. The channel of a field effect device must be a semiconductor region with high sheet resistivity, and available techniques lacked the control necessary to fabricate such high resistivity channels reproducibly for large-volume production.

A field effect semiconductor device which represents a practical solution to the manufacturing problems just referred to is described and claimed in a copending application of R. M. Warner, Jr., G. C. Onodera, and W. J. Corrigan, Serial No. 173,970 filed on February 19, 1962 (and now abandoned) and assigned to the present assignee. The particular devices and methods of making them described in that application have several advantages over earlier work: the channel is an epitaxial semiconductor region and therefore can be fabricated with a high degree of control over sheet resistivity; the geometry of the channel is defined by diffusion processing which lends itself well to this function; and the channel is "buried" within the semiconductor material such that the device can be stabilized or passivated more readily. Transistors and current limiters are described in the copending application; the present invention is an improvement of the current limiter devices which takes advantage of the features just outlined, and makes the current limiter easier to manufacture while at the same time improving its performance.

The semiconductor current limiter is a two-terminal or diode type of device whose output voltage-current characteristic has a constant current region, as will be described in connection with FIG. 3. Its constant voltage analogue is the semiconductor zener diode, and the latter devices have been commercially available for quite a few years and have been used in many applications. A constant current device like the semiconductor current limiter, when readily available, should also find wide application. However, in order to realize this potential, the current limiter must be extremely stable, must have good electrical characteristics, and must be competitive in price. Semiconductor current limiters proposed earlier have not had these features, whereas the device to be described herein does have them.

The current limiting region of the output characteristic of known semiconductor current limiters has not exhibited as constant a current as desired for many applications. The current limiter of this invention uses the screen effect described in a copending application of Geza Csanky, Serial No. 254,652, filed on January 29, 1963, and assigned to this assignee. In accordance with the screen effect, the voltage across a field effect channel is stabilized by an action which is functionally like that of the screen grid of a pentode tube which screens the control grid from variations of anode voltage, thus providing an output characteristic which is remarkably independent of anode voltage over a wide voltage range. As a result of the stabilization, the output characteristic of the current limiter is flattened such that a current limiter exhibiting the screen effect is more nearly a true constant-current device than earlier versions.

The specific embodiments illustrated in the Csanky application are either a combination of two discrete devices or an integrated circuit including two components formed in the same semiconductor element. The present invention is a single-component semiconductor device which can be fabricated much more economically than the two-component versions, and yet which meets all the requirements for the screen effect.

Present-day semiconductor devices used as current limiters have required packages somewhat more elaborate than the simplest packages used for many other semiconductor diodes. The reason is that the metal contacts on the semiconductor element have been extremely small, something like those of high-frequency transistors, and such contacts are not compatible with the comparatively large leads of simple diode packages such as the familiar glass-sealed package. Even though these packages are small by ordinary standards (about 0.3" long and 0.1" in diameter), the leads or connectors are gross compared to the tiny contacts of high frequency devices which may be as small as .001" x .002" for example.

The current limiter of this invention has a semiconductor element in which the junctions are so arranged that adequately large contacts can be applied to opposite faces of the element such that the element can be encapsulated using any of the simple double-ended diode packages, e.g., the glass-sealed package. It is significant that the critical junctions of the semiconductor can also be passivated using oxide coatings on the semiconductor surface, thereby ensuring that the device will have the high degree of electrical stability mentioned above as one of the requirements for a commercially acceptable semiconductor current limiter.

The invention is illustrated in the accompanying drawings, in which:

FIG. 1 is a schematic cross section of part of a semiconductor element for a current limiter in accordance with the invention;

FIG. 2 is a circuit equivalent for the current limiter of FIG. 1:

FIG. 3 is a plot of drain voltage versus drain current for a current limiter like FIG. 1, and the plot corresponds to a photograph of an oscilloscope display of an actual current limiter in accordance with the invention;

FIG. 4 is a cross section of another embodiment of the current limiter;

Figures 5, 6:
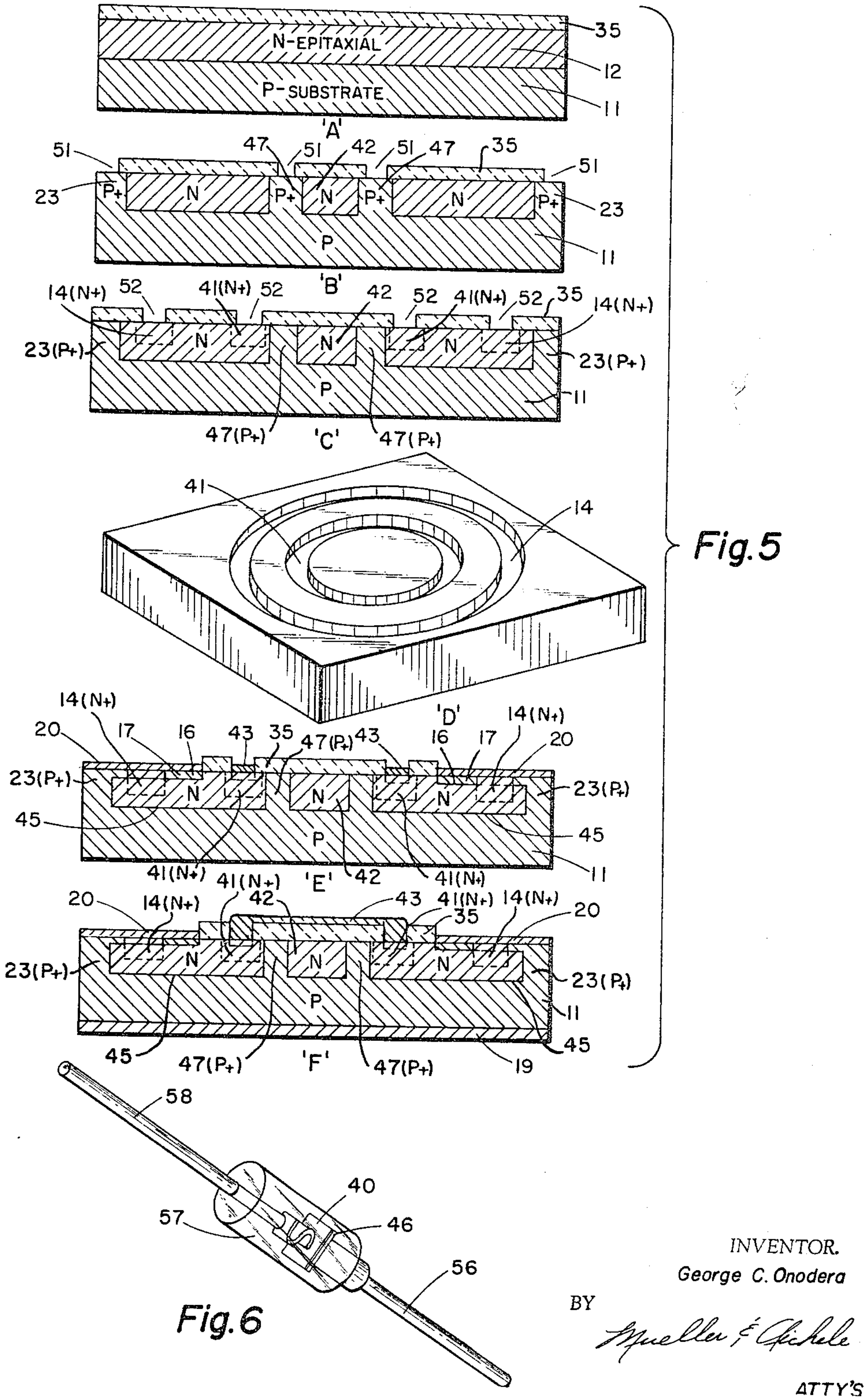
FIG. 5 is a flow chart illustrating the steps of a suitable method of making the current limiter of FIG. 4.
FIG. 6 shows a glass-sealed package which may be used for the semiconductor elements of FIGS. 1 and 4.

The semiconductor current limiter of this invention has an epitaxial channel with two distinct portions. For convenience, the two portions will be referred to herein as channel 1 and channel 2, but it should be understood that they are actually different portions of the same channel. There is a gate junction common to both channels on one side of them, and one of the channels has another gate junction on its other side. Thus, there is a single-gate channel and a double-gate channel, with one of the gates being common to both channels. If, for example, the channels have the same resistivity, length and thickness, the pinch-off voltage and current values of the single-gate channel are necessarily higher than those of the double-gate channel. As drain voltage is increased, the double-gate channel will pinch-off first, and then further increases of drain voltage will increase the bias on the single-gate channel since the voltage across the other channel appears between the source and gate of the single-gate channel. Consequently, the output current changes only a very small amount with drain voltage varying over the operating range; the desired result for a current limiter.

The flattening of the constant-current region of the output characteristic, as just described, is due to the difference between the pinch-off values of the two channels and the provision of a common gate on one side of the channels. With these conditions, the voltage at the drain end of the double-gate channel is effectively hidden or screened from voltage variations at the drain end of the single-gate channel because the latter voltage variations are taken up by the single-gate channel acting as a voltage variable resistance. With the drain voltage of the double-gate channel stabilized, it follows that the output current will be constant. Since the effect is something like that achieved with a screen electrode in a pentode tube, it will be referred to herein as the screen effect.

One of the significant advantages of the embodiments to be described is the relative ease with which they can be fabricated and passivated on a sufficiently reproducible basis for mass production. The critical sheet resistivity of the channel is controlled in an epitaxial growth step which is well-suited for this fuction, and the lateral geometry of the channel is controlled by masked diffusion steps which lend themselves to geometry definition. The common gate in a PN junction at the interface between the epitaxial channel and the substrate on which the epitaxial material is grown. The other gate may be a metallized contact alloyed to the top surface of the channel region opposite the common gate, and if this alloying is shallow enough, both channels have substantially the same thickness.

The gate metallization also contacts the source and is ohmically connected to the substrate through a diffused region such that the gates and the source are at about the same potential with voltage applied to the device. The source-gate terminal may be the support on which the semiconductor element is mounted. The drain contact is a separate metallization, and a lead is connected to this contact. The drain contact may be made large enough to be engaged directly by an ordinary lead of the type used in diode packages by using a particular annular configuration for the drain region, as will be described further.

FIG. 1 is a fragmentary cross section of the semiconductor unit of a current limiter device which is one embodiment of the invention. The semiconductor unit is symmetrical about a center line, and only half of the semiconductor unit has been shown in FIG. 1 in order to simplify the description.

The semiconductor unit 10 includes a P type substrate portion 11 and an N type epitaxial layer 12 on the substrate. The substrate 11 is a single-crytal semiconductor element, preferably of silicon, and the epitaxial layer 12 has been formed on the substrate by epitaxial growth of phosphorous-doped silicon from the vapor phase such that the layer 12 extends the crystal structure of the substrate 11. There is a rectifying junction 13 between the epitaxial layer and the substrate, and this junction is on the same side and is common to two portions of a channel which extends between diffused regions 14 and 15 in the epitaxial layer 12. The two portions of the channel are designated channel 1 and channel 2 in FIG. 1, but it may be seen that they are not physically separate from each other. The N+ diffused region 14 constitutes a source connection to channel 1, and the other N+ diffused region 15 constitutes a drain connection to channel 2. The substrate 11 serves as a gate region, and the junction 13 is therefore a gate junction common to both channels.

Channel 1 has another gate junction 16 on the side of the channel opposite the common gate junction 13. The top gate junction 16 is formed by a P type alloy regrowth region 17 located under a metallized contact 20 on the top surface of the semiconductor unit. The metal contact 20, which may be of aluminum, is actually alloyed to the entire underlying surface portion of the semiconductor unit, but only in region 17 is the concentration of acceptor impurities sufficient to convert the regrown crystal material to P type semiconductor material. The metallized contact 20 is only a few hundred angstrom units thick, and therefore the P type alloyed region 17 is correspondingly thin; in fact, its thickness has been exaggerated in the drawings in order to show it at all. Thus, even though there is a gate region on the top side of channel 1 and no gate region on the top side of channel 2, the thickness of the two channel portions is very nearly the same.

As previously mentioned, in order for the current limiter to exhibit the screen effect, the channel portion adjoining the drain region must have higher pinch-off current and voltage values than the channel portion adjoining the source region. Since channel 1 has two gates, one on each side, and channel 2 has only a single gate (junction 13) which is shared with channel 1, channel 1 will pinch off at lower values of current and voltage than channel 2 so long as channel 2 is not too long relative to channel 1, and both channels have approximately the same thickness. It is not essential that the length of the channels be the same as shown in FIG. 1, but channel 2 should be short enough compared to channel 1 to assure that its pinch-off current and voltage values will be higher than those of channel 1. Likewise equal channel thicknesses are not a necessity since the single-gate channel can be thinner than the double-gate channel and still have a higher pinch-off voltage. In fact, a slightly improved electrical characteristic would be obtained by making the single-gate channel thinner and changing channel lengths. However, processing would be more difficult. Unless the thickness of channel 2 is approximately the same as or slightly less than that of channel 1, the difference between the pinch-off voltage and current values of the two channels will be too great to achieve the screen effect. Specifically, one of the junctions 13 and 16 will exhibit avalanche breakdown before channel 2 pinches off if channel 2 is substantially thicker than channel 1.

It may be seen from FIG. 1 that the source-gate terminal 18 is connected to a metallized layer 19 on the bottom surface of the semiconductor unit, and the drain terminal 21 is connected to a metallized contact 22 which provides an ohmic connection to the N+ diffused drain region 15. The ability to have the drain terminal 21 connected to one side of the semiconductor unit and the source-gate terminal 18 connected to the other side of the semiconductor unit and still have only two external connections to the semiconductor unit is a significant feature of the invention. This is achieved by having the P+ diffused region 23 extending from the top surface of the semiconductor unit through the epitaxial layer 12 to provide a low resistance interconnecting path to the substrate 11. The metallized contact 20, then, interconnects the bottom gate provided by the substrate 11, the source region 14, and the top gate provided by the alloyed region 17 such that all of these regions are at about the same potential with voltage applied across terminals 18 and 21. The conductivity of regions 11 and 23 is high enough to make the voltage drop in them insignificant.

The operation of the current limiter of FIG. 1 will be described with reference to FIGS. 2 and 3. FIG. 2 is a schematic diagram of the circuit equivalent of the current limiter of FIG. 1, and FIG. 3 shows the output characteristic of the current limiter of FIG. 1. From FIG. 3, it may be seen that the portion of the characteristic curve between points X and Y is the current limiting region of the device, and that current through the device in this region is very nearly constant. For example, in a particular constructed embodiment of the invention, the difference in current between points X and Y of the characteristic curve may be only a few microamperes.

The high degree of flatness of the current limiting region of the curve is due to the screen effect as previously described, and this effect may be understood clearly with the aid of the circuit equivalent of FIG. 2. In FIG. 2, the double-gate transistor 26 corresponds to the double-gate channel 1 in the semiconductor unit 10 of FIG. 1, and the single-gate transistor 27 corresponds to the single-gate channel 2 in FIG. 1. The source 28 of transistor 27 is connected to the drain 29 of transistor 26 so that the channels of the two transistors are in series electrical relation like channel 1 and channel 2 in the semiconductor unit 10 of FIG. 1. The source-gate terminal 18 and the drain terminal 21 for the assembly of FIG. 2 corresponds to the equivalent terminals in FIG. 1. The two gates 31 and 32 and the source 33 of transistor 26 are shorted together such that the same potential appears at these portions of the transistor 26. The gate 34 of transistor 27 is connected to the gate 31 of transistor 26 such that gates 31 and 34 are electrically common and are equivalent to the common gate provided by the substrate 11 and the rectifying junction 13 for channel 1 and channel 2 of FIG. 1.

With increasing voltage applied between terminals 18 and 21, the drain current at terminal 21 will increase until the channel of transistor 26 pinches off. This corresponds to the pinching off of channel 1 in the unit of FIG. 1 at point X of the characteristic curve. It is assumed that transistor 27 has higher values of pinch-off current and pinch-off voltage than transistor 26 to satisfy the conditions for the screen effect as previously described. Then as the applied voltage increases further, the increase is taken up by the single-gate transistor 27 without substantially increasing the voltage at the drain 29 of transistor 26. This is because any slight increase of the drain-source voltage across transistor 26 appears as an increased bias between the source 28 and the gate 34 of transistor 27, and the increased bias increases the resistance of the latter transistor. In the same way, any increase in the voltage dropped across channel 1 with increasing applied voltage will increase the voltage between the source end of channel 2 and its gate region 11, thereby increasing the resistance of that channel to take up the incremental increase of applied voltage.

Since the voltage dropped across channel 1 (equivalent to the drain-source voltage across transistor 26) remains nearly constant with increasing applied voltage between terminals 18 and 21, it is evident that drain current at terminal 21 must remain substantially constant throughout the operating range of the device. The high current end of this operating range is fixed by the avalanche breakdown voltage of junction 13 only since junction 16 reaches only a value slightly higher than pinch-off. When breakdown occurs, the drain current increases sharply. Avalanche breakdown begins at point Y in FIG. 3.

In the semiconductor unit 10 of FIG. 1, the diffused source region 14 is actually an annular ring near the periphery of the semiconductor element. The diffused drain region 15 is at the center of the semiconductor unit and may be made sufficiently large that one of the leads of a diode package may be connected directly to the metallized contact 22. However, if the gate junction 13 extends entirely across the semiconductor element, which is the case when the drain comprises the entire metallized center area 22, capacitance between the source and the drain will be relatively large since the drain area 15 will be correspondingly large. This may unduly limit the maximum frequency at which the device can be operated.

The embodiment of FIG. 4 is constructed so as to reduce the drain junction capacitance and still provide a large enough drain contact to allow one of the leads of a diode package to be connected to that contact. This is accomplished as shown in FIG. 4 by means of an annular P type diffusion 47 which isolates the annular N type diffused drain region 41 from the center N type epitaxial region 42. Both the P type diffused region 47 and the N type epitaxial region 42 are insulated from the drain contact 43 by an oxide coating 44. The remaining portions of the semiconductor unit 40 of FIG. 4 are like corresponding portions of the semiconductor unit 10 of FIG. 1, so the same reference numerals have been applied to like portions. The source-gate terminal 18 is shown connected to a metal mounting member 46 on which the semiconductor unit 40 is mounted, and the member 46 may be simply a metal support or may be the metal of a mounting header if desired.

The reduction of gate-drain capacitance achieved by the configuration of FIG. 4 is due to the following factors. Since the gate junction 45 is annular, it will be smaller in area than the gate junction 13 of FIG. 1 which extends across nearly the entire diameter of the semiconductor unit, assuming that the semiconductor units 10 and 40 are the same size. Since the drain area has been significantly reduced, this alone would account for some reduction of capacitance, but an even further reduction is accomplished by leaving the epitaxial N type region 42 within the P type material at 47 and forming another junction 48. The capacitance between the metallized drain contact and the N type epitaxial region 42 using the oxide 44 as the dielectric is in series with the capacitance of the junction 48, and this series combination of capacitance is in parallel with the capacitance of junction 45. The equivalent capacitance of the series combination is less than the capacitance of the metal-oxide along which in turn is less than the P-N junction. Thus, the over-all capacitance is reduced by leaving the N type epitaxial region 42 as compared to the case where this epitaxial region is absent but the annular N+ drain region is present.

The steps of a suitable method for fabricating the semiconductor unit 40 are shown in FIG. 5. It will be understood that the processing to be described would in practice be carried out so as to form many semiconductor units, perhaps one hundred or more, in a single semiconductor wafer. The processing steps for a single semiconductor unit have been shown in FIG. 5 in order to simplify the description and because the details of processing of multiple units in a single wafer is not essential to an understanding of the invention.

In step A, there is shown a P type substrate crystal element 11 with an N type epitaxial layer 12 on it covered by an insulating oxide layer 35. The substrate and the epitaxial layer are preferably of silicon, and the coating 35 is then silicon dioxide. Semiconductor processing for fabricating a unit of the type shown in step A of FIG. 5 is known in the art, and an example of processing is described and claimed in a copending application of J. T. Law, Serial No. 168,425, filed on January 24, 1962, now Patent No. 3,173,814, issued March 16, 1965, and assigned to the present assignee.

In step B of FIG. 5, the interconnecting region 23 and the isolating region 47 have been diffused through the epitaxial layer 12 by a masked diffusion step in which an acceptor impurity such as boron is diffused into the semiconductor unit through annular openings 51 in the oxide coating 35.

In step C, the N+ source and drain regions 14 and 41 have been diffused into the semiconductor unit through annular openings 52 in the oxide coating 35. It will be understood that after step B, the oxide coating 35 was regrown over the entire top surface of the semiconductor unit,and a new set of openings 52 were formed to prepare the semiconductor unit for a diffusion step to form the regions 14 and 41. The impurity which is diffused into regions 14 and 41 is a donor impurity such as phosphorous. Selective diffusion steps such as those described in connection with steps B and C are well-known in the semiconductor art and need not be described here in complete detail.

Step D is merely an isometric view of the semiconductor unit at the same stage of processing as step C, and it serves to illustrate that the diffused regions 41 and 14 under the openings 52 are annular in configuration.

Steps E and F illustrate the manner in which the metallized contacts are applied to the semiconductor unit. The oxide coating 35 is regrown and new openings are etched to the configuration shown in step E. A P type contact metal such as aluminum is then vapor-deposited on the top surface of the semiconductor unit, and excess metal is removed from the oxide coating 13 to define the separate metal contacts 20 and 43. These contacts are both annular in configuration as shown in step E. The semiconductor unit is subjected to a heating cycle to alloy the contacts 20 and 43 with the underlying semiconductor material. The alloying forms ohmic contacts to the diffused regions and converts the region 17 to P type semiconductor material and forms the top gate junction 16 for the double-gate channel portion. The bottom gate junction which is common to both channel portions is the annular junction 45 as shown in FIG. 4 and in step E in FIG. 5.

Then the semiconductor unit goes through a second metallizing operation in which the metal contact 43 is extended over the portion 44 of the oxide coating 35 at the center of the semiconductor unit so as to enlarge this contact. The resulting enlarged contact 43 is big enough to allow connecting of a standard lead unit for a diode package directly to it. The source-gate contact 19 may also be evaporated on the bottom surface of the semiconductor unit at this stage of the processing.

FIG. 6 shows a standard glass-sealed diode package of a type which may be used to provide a sealed enclosure for the semiconductor units 10 and 40. In FIG. 6, a semiconductor unit 40 is shown by way of example, and it is mounted on a metal member 46 which in turn is bonded to a lead unit 56. The lead unit 56 is sealed to the glass envelope 57 at one end of the package, and the other lead unit 58 is sealed to the glass envelope 57 at its other end. There is an S-shaped member at the inner end of the lead unit 58, and this member is connected directly to the drain contact 43 of the semiconductor unit 40. The lead units are then the two terminals of the device.

Thus, the invention provides an improved semiconductor current limiter which exhibits the screen effect, which can be fabricated by relatively simple and reproducible processing, and which can be encapsulated in a standard diode package. All of these factors contribute to making the current limiter superior to known devices from a performance and stability standpoint and competitive in price with presently available semiconductor devices which might be used for current limiting.

The invention is defined by the claims which follow:

1. A field effect semiconductor device including in combination, a semiconductor crystal element of a selected conductivity type, a first semiconductor layer on said crystal element of a conductivity type opposite to said selected conducting type and having portions which form first and second channel regions which merge together, said first layer having portions of said opposite conductivity type forming a source connection to said first channel region and a drain connection to said second channel region, said channel regions and said crystal element forming a first rectifying junction therebetween, a second semiconductor layer of said selected conductivity type bounding only said first channel region on the side thereof opposite said crystal to form a second rectifying junction, said crystal element forming a first gate coupled to said first and second channel regions and said second layer forming a second gate coupled only to said first channel region, said first and second channel regions having thickness and length dimensions related to each other so that the pinch-off current and voltage values of said second channel region exceed those of said first channel region.

2. A semiconductor device in accordance with claim 1 wherein said first layer is of epitaxial material formed on said crystal element.

3. A two-terminal field effect semiconductor device including a semiconductor unit having a semiconductor layer forming a channel having first and second portions of the same conductivity type which merge together, said semiconductor layer having portions which form a source connection to said first channel portion and a drain connection to said second channel portion, semiconductor means forming a first gate region bounding only said first channel portion on one side thereof and forming a first rectifying junction therewith and forming a second gate region bounding both of said channel portions on the side thereof opposite said first rectifying junction and forming a second rectifying junction therewith, said first and second gate regions extending respectively to first and second surfaces of said semiconductor unit on opposite sides thereof, said second channel portion having a thickness dimension approximately equal to or less than that of said first channel portion and having a length dimension related to that of said first channel portion so that the pinch-off current and voltage values of said second channel portion exceed those of said first channel portion, said source and drain portions of said layer extending to said first surface of said semiconductor unit, said unit having an interconnecting region of the opposite conductivity type extending from said first surface thereof to said second gate region and providing a low resistance path through said semiconductor unit, a first contact on said first surface connected to said drain portion, a second contact on said second surface connected to said second gate region, and a third contact on said first surface connected to said source portion, said first gate region and said interconnecting region, thereby making said source portion and said gate regions electrically common, and two terminals connected respectively to said first and second contacts.

4. A two-terminal field effect semiconductor device including, a semiconductor unit having a semiconductor layer forming a channel with first and second portions of the same conductivity type merging together, semiconductor means of conductivity type opposite to that of said channel bonding said first channel portion on one side thereof and forming a first gate region which cooperates with said first channel portion to provide a first rectifying junction, semiconductor means of said opposite conductivity type bounding said first and second channel portions on the side thereof opposite said first rectifying junction and forming a second gate region which cooperates with said channel portions to provide a second rectifying junction, said first and second gate regions extending respectively to first and second surfaces of said semiconductor unit on opposite sides thereof, said second channel portion having a thickness dimension approximately equal to or less than that of said first channel portion and said second channel portion having a length dimension short enough compared to that of said first channel portion so that the pinch-off current and voltage values of said second channel portion exceed those of said first channel portion, means forming a source connection to said first channel portion and a drain connection to said second channel portion, said source and drain connection means including regions of the same conductivity type as said channel and extending to said first surface of said semiconductor unit, means interconnecting said source region and said gate regions including a first metal contact on said semiconductor unit, a second metal contact connected to said drain region, first and second connector means connected respectively to said metal contacts providing the two terminals of said device, and means encapsulating said semiconductor unit and portions of said connector means, with said connector means having portions available for making external electrical connections to said device.

5. A two-terminal field effect semiconductor device including, a semiconductor unit having a semiconductor layer forming a channel with first and second portions of the same conductivity type merging together, semiconductor means forming a first gate region bounding said first channel portion on one side thereof and forming therewith a first rectifying junction and a second gate region bounding both of said channel portions on the side thereof opposite said first rectifying junction and forming therewith a second rectifying junction, said first and second gate regions extending respectively to first and second surfaces of said semiconductor unit on opposite sides thereof, said first and second channel portions having thickness and length dimensions related to each other so that the pinch-off current and voltage values of said second channel portion exceed those of said first channel portion, said semiconductor layer having portions forming a source connection to said first channel portion and a drain connection to said second channel portion and extending to said first surface of said semiconductor unit, an interconnecting region of the opposite conductivity type extending from said first surface to said second gate region providing a low resistance path through said semiconductor unit, a first metallized contact on said first surface connected to said drain region, a second metallized contact on said second surface connected to said second gate region, a third metallized contact on said first surface connected to said source region and said first gate region and said interconnecting region, thereby making said source and gate regions electrically common, first lead means connected to said first metallized contact and providing one terminal of said device, second lead means connected to said second metallized contact providing the second terminal of said device, and means encapsulating said semiconductor unit and portions of said lead means, with said lead means having other portions outside said encapsulating means available for making external electrical connections.

6. A two-terminal field effect semiconductor device including a semiconductor unit having a semiconductor layer forming a channel of one conductivity type, semiconductor means forming first and second gate regions of the opposite conductivity type on opposite sides of said channel and extending respectively to first and second surfaces on opposite sides of said unit, said semiconductor layer having an annular source region of the same conductivity type as said channel about said first gate region and providing a source connection to said channel, said semiconductor layer having an annular drain region of the same conductivity type as said channel located centrally of said source region and said first gate region and providing a drain connection to said channel, said source and drain regions extending to said first surface, an isolating region of the opposite conductivity type located centrally of said drain region and merging into said second gate region at a portion thereof, an insulating layer on a surface of said semiconductor unit over said isolating region, said channel and said first gate region forming a first rectifying junction bounding only a first portion of said channel adjoining said source region, said channel and said second gate region forming a second rectifying junction bounding the entire length of said channel, said semiconductor unit having an interconnecting region of said opposite conductivity type extending from said first surface to said second gate region, a first contact connected to said drain region and extending over said insulating layer, a second contact on said second surface connected to said second gate region, a third contact on said first surface connected to said source region and said first gate region and said interconnecting region thereby making said source and gate regions electrically common, first and second terminal means connected respectively to said first and second contacts, and means encapsulating said semiconductor unit and portions of said terminal means.

7. A two-terminal field effect semiconductor device, including a semiconductor unit having a semiconductor layer forming a channel of one conductivity type, semiconductor means engaging said semiconductor layer and forming first and second gate regions of the opposite conductivity type on opposite sides of said channel and extending respectively to first and second surfaces of said unit, said layer having an annular source region about said first gate region of the same conductivity type as said channel and providing a source connection to said channel and an annular drain region located centrally of said source and first gate regions of the same conductivity type as said channel and providing a drain connection to said channel, said source and drain regions extending to said first surface, said semiconductor unit having an isolating region of the opposite conductivity type located centrally of said drain region and merging into said second gate region at a portion thereof, an insulating layer on a surface of said semiconductor unit over said isolating region, said semiconductor unit having on interconnecting region of said opposite conductivity type extending from said first surface to said second gate region, a first contact connected to said drain region and extending over said insulating layer, a second contact connected to said second gate region, a third contact connected to said source region, said first gate region and said interconnecting region making said source region and said gate regions electrically common, and first and second terminal means connected respectively to said first and second contacts.

8. A field effect semiconductor device including, a semiconductor unit having a semiconductor layer forming a channel of one conductivity type, semiconductor means engaging said semiconductor layer and forming first and second gate regions of the opposite conductivity type on opposite sides of said channel and extending respectively to first and second surfaces on opposite sides of said unit, said layer having an annular source region about said first gate region of the same conductivity type as said channel and providing a source connection to said channel and an annular drain region located centrally of said source and first gate regions, said drain region being of the same conductivity type as said channel and providing a drain connection to said channel, said source and drain regions extending to said first surface, said unit having an isolating region of the opposite conductivity type located centrally of said drain region and merging into said second gate region at a portion thereof and a region of the same conductivity type as said channel located within said isolating region and forming a PN junction therein for reducing total parasitic capacitance, an insulating layer on a surface of said semiconductor unit over said last-named region and said isolating region, a first contact connected to said drain region and extending over said insulating layer, and further metallized contacts connected to said source and gate regions.

9. A field effect semiconductor device including, a semiconductor unit having a semiconductor layer forming a channel of one conductivity type, semiconductor means engaging said layer and forming first and second gate regions of the opposite conductivity type on opposite sides of said channel, said layer having an annular source region about said first gate region of the same conductivity type as said channel and providing a source connection to said channel and an annular drain region located centrally of said source and first gate regions, said drain region being of the same conductivity type as said channel and providing a drain connection to said channel, said unit having an isolating region of the opposite conductivity type located centrally of said drain region and merging into said second gate region at a portion thereof, an insulating layer on a surface of said semiconductor unit over said isolating region, a first metallized contact connected to said drain region and extending over said insulating layer, and further metallized contacts connected to said source and gate regions.

References Cited by the Examiner

UNITED STATES PATENTS

| | | | |
|---|---|---|---|
| 3,081,421 | 3/1963 | Roka | 317—234 |
| 3,130,378 | 4/1964 | Cook | 331—111 |

JOHN W. HUCKERT, *Primary Examiner.*

R. F. SANDLER, *Assistant Examiner.*